United States Patent [19]

Bolon et al.

[11] Patent Number: 4,855,199
[45] Date of Patent: Aug. 8, 1989

[54] PHOTOPATTERNED PRODUCT OF SILICONE POLYAMIC ACID ON A TRANSPARENT SUBSTRATE

[75] Inventors: Donald A. Bolon, Scotia; Victoria J. Eddy, Schenectady; John E. Hallgren, Scotia, all of N.Y.

[73] Assignee: General Electric Company, Schenectady, N.Y.

[21] Appl. No.: 229,667

[22] Filed: Aug. 8, 1988

Related U.S. Application Data

[62] Division of Ser. No. 33,938, Apr. 3, 1987, Pat. No. 4,782,009.

[51] Int. Cl.$^4$ ................................................. G03C 3/00
[52] U.S. Cl. ........................................ 430/18; 430/14; 430/17; 430/272; 430/326; 156/628
[58] Field of Search ..................... 430/14, 18, 17, 270, 430/272, 326; 156/628

[56] References Cited

U.S. PATENT DOCUMENTS

| | | | |
|---|---|---|---|
| 3,886,865 | 6/1975 | Ohto et al. | 430/272 |
| 4,381,396 | 4/1983 | Ryang | 430/272 |
| 4,410,612 | 10/1983 | Goff et al. | 430/18 |
| 4,454,220 | 6/1984 | Goff | 430/18 |
| 4,510,227 | 4/1985 | Mohr | 430/272 |
| 4,600,685 | 7/1986 | Hitakohf et al. | 430/272 |
| 4,782,009 | 11/1988 | Bolon et al. | 430/272 |

*Primary Examiner*—Jack P. Brammer
*Attorney, Agent, or Firm*—William A. Teoli; William H. Pittman; James C. Davis, Jr.

[57] ABSTRACT

Photopatternable silicone polyamic acid can be spun onto a substrate and thereafter used in combination with a photoresist as an antireflective coating or as a patterned silicone polyimide. The silicone polyamic acid can be used with an absorbing dye, or it can be tinted with an organic dye to provide color filters when applied on a transparent substrate.

2 Claims, No Drawings

PHOTOPATTERNED PRODUCT OF SILICONE POLYAMIC ACID ON A TRANSPARENT SUBSTRATE

This application is a division of application Ser. No. 033,938 filed Apr. 3, 1987, now U.S. Pat. No. 4,782,009.

BACKGROUND OF THE INVENTION

The present invention relates to silicone polyamic acid which can be photopatterned on various substrates such as glass, silicon, or aluminum and method for making such materials. More particularly, the present invention relates to photopatternable silicone polyamic acid which can be used as an antireflective coating for patterning photoresists, or can be photopatterned on a transparent substrate such as silicon or glass and thereafter imidized to provide for the production of a color filter.

Prior to the present invention, polyamic acid solutions, such as Pyralin polyamic acid, was used to coat various substrates to thicknesses of about 2.5 microns by a standard spinning technique. The applied polyamic acid, a copolymer of pyromellitic dianhydride and 4,4'—oxydianiline in N-methylpyrrolidone had to be refrigerated during storage at 4° C. maximum, or it readily converted to the insoluble imidized state. As a result, it was difficult to spin dry Pyralin polyamic acid to a tack-free state, prior to applying a positive photoresist to its surface, followed by photopatterning and developing.

Improved polyamic acid photopatterning was achieved by utilizing a silicone polyamic acid, resulting from the intercondensation of benzophenone dianhydride and a polydiorganosiloxane having terminal aminoalkyl groups attached to silicon by silicon-carbon linkages. Although improved adhesion to silicon or glass was achieved with the use of such silicone polyamic acid, as compared to Pyralin polyamic acid, it was found that the problem of premature imidization also occured during the drying of the applied silicone polyamic acid prior to the spin coating of the photoresist. The work-life of the silicone polyamic acid as well as its usefulness during the development of the applied photoresist also was unsatisfactory.

The present invention is based on the discovery that certain silicone polyamic acids, resulting from the use of a siloxane containing norbornane bisanhydride (DiSiAn), shown by Ryang U.S. Pat. No. 4,381,396, assigned to the same assignee as the present invention and incorporated herein by reference, in combination with benzophenone dianhydride (BTADA) and aryldiamine, have been found to resist excessive imidization during the initial drying step of the silicone polyamic acid after its application to a substrate. Temperatures up to 125° C. for a period of 60 minutes can be used to make tack-free silicone polyamic acids which can be readily patterned during the development of a photopatterned photoresist. Surprisingly, the patterned silicone polyamic acid thereafter can be readily removed if used as an antireflective coating. The patterned silicone polyamic acid also can be fully imidized, rendering it substantially insoluble in conventional organic solvents, such as N-methylpyrrolidone in instances where it is used to make a color filter.

STATEMENT OF THE INVENTION

There is provided by the present invention, a method for patterning adherent silicone polyamide acid on the surface of at least a portion of a substrate, where the silicone polyamic acid is patterned by (1) spin coating a silicone polyamic acid onto the surface of the substrate, (2) drying the silicone polyamic acid at a temperature of at least 100° C., (3) spin coating a positive photoresist onto the surface of the silicone polyamic acid to produce a silicone polyamic acid-photoresist composite, (4) exposing the applied positive photoresist to patterned UV light, and (5) developing the resulting patterned silicone polyamic acid-photoresist composite, where the silicone polyamic acid is the intercondensation product of reaction of about 2% less than stoichiometric, to about stoichiometric, of aryldiamine and organic dianhydride, comprising a mixture of from about 20 to 80 mole percent of norbornane organosiloxane bisanhydride and from about 80 mole percent to about 20 mole percent of aromatic organic bisanhydride, and preferably from about 30 to 70 mole percent of norbornane organosiloxane bisanhydride and from about 70 mole percent to 30 mole percent of aromatic organic bisanhydride based on the total moles of organic dianhydride.

In a further aspect of the present invention, there is provided a method for patterning adherent siliconepolyimide onto the surface of a transparent substrate which comprises, (1) spin coating a silicone polyamic acid onto the surface of a transparent substrate, (2) drying the silicone polyamic acid at a temperature of at least 100° C., (3) spin coating a positive photoresist onto the surface of the silicone polyamic acid to produce a silicone polyamic acid-photoresist composite, (4) exposing the applied positive photoresist to patterned UV light, (5) developing the resulting patterned silicone polyamic acid-photoresist composite, (6) stripping the photoresist from the surface of the silicone polyamic acid, and (7) heating the resulting patterned silicone polyamic acid until imidized, where the silicone polyamic acid is as previously defined.

In an additional aspect of the present invention, there is provided a photoimaging method for patterning a substrate, using an antireflective silicone-polyamic acid coating which comprises, (1) spin coating a silicone polyamic acid having an effective amount of an organic dye with a maximum absorption coefficient in the range of 200 nm to 450 nm, (2) drying the silicone polyamic acid at a temperature of at least 100° C., (3) spin coating a positive photoresist onto the surface of the silicone polyamic acid to produce a silicone polyamic acid-photoresist composite, (4) exposing the applied positive photoresist to patterned UV light, (5) developing the resulting patterned silicone polyamic acid-photoresist composite (6) etching exposed substrate through the patterned silicone polyamic acid-photoresist composite, and (7) stripping the silicone polyamic acid-photoresist composite from the resulting etched substrate where the silicone-polyamic acid is as previously defined.

The norbornane anhydride terminated organosiloxane which can be used in the practice of the present invention is shown by Ryang, U.S. Pat. Nos. 4,381,396 and 4,404,350, assigned to the same assignee as the present invention and incorporated herein by reference. For example, there can be used 5,5'-(1,1,3,3-tetramethyl-1,1,3-disiloxanediyl)-bis-norbornane-2,3-dicarboxylic anhydride.

Organic dianhydrides which can be used in combination with the above-described norbornane anhydride terminated organosiloxane are, for example, benzophenone dianhydride, pyromellitic dianhydride, oxybisphthalic anhydride, and tetracarboxybiphenyl dianhydride.

Organic diamines which can be used in the practice of the present invention to make the afore-described silicone polyamic acid are, for example,
m-phenylenediamine;
p-phenylenediamine;
4,4'-diaminodiphenylpropane;
4,4'-diaminodiphenylmethane;
benzidine;
4,4'-diaminodiphenyl sulfide;
4,4'-diaminodiphenyl sulfone;
4,4'-diaminodiphenyl ether;
1,5-diaminonaphthalene;
3,3'-dimethylbenzidine;
3,3'-dimethoxybenzidine;
2,4-diaminotoluene;
2,6-diaminotoluene;
2,4-diamino-t-butyl toluene;
1,3-diamino-4-isopropylbenzene;
1,2-bis(3-aminopropoxy)ethane;
m-xylylenediamine;
p-xylylenediamine;
bis(4-aminocyclohexyl)methane;
decamethylenediamine;
3-methylheptamethylenediamine;
4,4-dimethylheptamethylenediamine;
2,11-dodecanediamine;
2,2-dimethylpropylenediamine;
octamethylenediamine;
3-methoxyhexamethylenediamine;
2,5-dimethylhexamethylenediamine;
2,5-dimethylheptamethylenediamine;
3-methylheptamethylenediamine;
5-methylnonamethylenediamine;
1,4-cyclohexanediamine;
1,15-octadecanediamine;
bis(3-aminopropyl)sulfide;
N-methyl-bis(3-aminopropyl)amine;
hexamethylenediamine;
heptamethylenediamine;
2,4-diaminotoluene;
nonamethylenediamine;
2,6-diaminotoluene;
bis-(3-aminopropyl)tetramethyldisiloxane, etc.

Another aspect of the present invention is directed to photopatternable silicone polyamic acid which contain from 2% to 40% by weight of compatible organic dye based on the weight of silicone polyamic acid and such compatible organic dye to provide for photopatterned tinted silicone polyimide. For example, there can be used in the practice of the present invention, silicone polyamic acid which can be combined with a green, red, blue or yellow dye to provide for the production of color filters useful for liquid crystal displays.

A further aspect of the present invention is directed to silicone polyamic acid which contains a sufficient amount of an organic dye capable of absorbing in the 200 to 450 nm region to produce an antireflective surface effect during photoimaging. Depending upon the absorption capacity and thickness of coating used, the weight % of the dye can vary. For example, there can be used 2% to 30% by weight of an absorbing dye such as coumarin based on the weight of silicone-polyamic acid.

Some of the organic dyes which can be utilized in the practice of the present invention in combination with the silicone polyamic acid to make tinted silicone-polyimide are, for example, commercially available green dyes such as acid green 41, acid green 25, Naphthol green B, red dyes such as chromotrope 2B, Direct red 81, and blue dyes such as acid blue 80, Chicago sky blue, and aniline blue.

A variety of the above acid dyes can be modified in accordance with the practice of the invention for use in polyamic acids. The sodium cations which are characteristic of the acid dyes can be replaced with a variety of onium cations, typically quaternary ammonium or phosphonium cations such as benzyltrimethylammonium, tetrabutylammonium, tetraethylammonium, and tetrabutylphosphonium. The modified dyes can be prepared by extraction of an aqueous slurry of the commercial acid dye with methylene chloride. The solvent can be stripped to obtain the modified dye in high yield. The modified dyes were found to be soluble in N-methylpyrrolidone, in polyamic acid films and in polyimide films. The visible spectra of the onium salt dyes were undistinguishable from the sodium cation dyes.

The silicone polyamic acid used in the practice of the present invention is preferably prepared by a two-step process from aryldiamine and mixtures of norbornane anhydride terminated organosiloxane, hereinafter referred to as "DiSiAn" and organic aromatic dianhydride which is preferably benzophenone dianhydride or hereinafter "BTDA". An intercondensation solution can be used having from 10% to 30% by weight solids in a dipolar aprotic solvent. Among the dipolar aprotic solvents which can be used in the practice of the method of the present invention to prepare the silicone polyamic acid, there are included N-methylpyrrolidone, N,N-dimethylformamide.

Preferably, N-methylpyrrolidone is used as the dipolar aprotic solvent. Preferably a two-step process can be used where the ratio of DiSiAn to BTDA can be varied. The preferred procedure is to ensure incorporation of the less reactive DiSiAn with aryldiamine for 30-60 minutes at about 90 to 100° C. Incorporation of the BTDA can then proceed. During intercondensation, the mixture can be agitated, such as by stirring. After dissolution of the BTDA, the solution can be maintained at 100 to 110° C. for an additional hour.

If desired, from 2% to 30% by weight of a suitable organic dye which is compatible with the silicone polyamic acid can be added with stirring. The tinted polyamic acid can then be spread as a thin film at thicknesses of from 1 to 20 microns on a suitable transparent substrate such as glass, silicon substrate or thermoplastic, for example polymethylmethacrylate, Lexan polycarbonate, thereafter heated to a temperature in the range of from 100° C. to 125° C. to effect the removal of excess organic solvent. When the dried polyamic acid film is substantially tack-free, a suitable positive photoresist or negative photoresist can be spin coated onto its surface. The photoresist can be applied to a thickness of about 5 to 2 microns. The resulting composite can then be heated at a temperature from 80° C. to 100° C. to effect the removal of excess solvent, such as water or inert organic solvent.

In a preferred procedure for making the silicone polyamic acid, an excess of the aryldiamine is avoided to minimize the production of gelled particles which can adversely alter the film characteristics of the resulting silicone polyamic acid and silicone polyimide.

A color filter can be prepared in accordance with the practice of the method of the present invention on a transparent substrate utilizing a step-wise procedure for applying tinted silicone polyimide. For example, a transparent substrate can be initially patterned with transparent silicone polyamic acid, tinted red, in accordance with the aforedescribed procedure. The silicone polyamic acid can thereafter be imidized by heating to a temperature of 200° C. for 60 minutes. The red tinted silicone polyimide will transmit red light, which can be patterned on the transparent substrate as an array of squares, 250 microns on each side. Areas free of tinted silicone polyimide will transmit white light. The substrate can then be treated with additional tinted silicone polyamic acid, for example blue tinted silicone polyamic acid, and the process repeated. By the proper choice of masks and tinted silicone polyamic acid, a color filter can be made capable of exclusively transmitting blue, green and red light.

The following examples are given by way of illustration and not by way of limitation. All parts are by weight.

EXAMPLE 1

A mixture of 3.7008 grams (8.00 millimoles) of 5,5'-(1,1,3,3-tetramethyl-1,1,3-disiloxanediile)-bis-norbornane 2,3-dicarboxylic anhydride (DiSiAn), 2.1412 grams (19.8 millimoles) of metaphenylenediamine (MPD), and 23 grams of N-methylpyrrolidone (NMP) was warmed with stirring to 60° C. for 30 minutes to effect complete solution and the formation of a silicone polyamic acid. There was then added to the mixture 3.9326 grams (12.20 millimoles) of benzophenonedianhydride (BTDA), while the mixture was stirred to provide a molar proportion of 40:60 of DiSiAn to BTDA units in the mixture. The mixture was then heated with stirring to 80° C. and aliquots were withdrawn at 10-minute intervals. Approximately 5 mil thick films were drawn onto glass slides and dried at 100° C. for 30 minutes. Some of the film were baked an additional 30 minutes at 200° C. The solubilities of the resulting films were then tested by immersing them in a 0.5% by weight of aqueous tetramethyl ammonium hydroxide or sodium hydroxide solution "aqueous caustic" and also by baking the films an additional 30 minutes at 200° C. followed by immersion in NMP to determine their solubility in NMP. The following results show the aqueous caustic and NMP solubilities of films obtained from aliquots of silicone polyamic acid withdrawn at 10-minute intervals over a period of from 0 to 120 minutes from the reaction mixture.

TABLE 1

| Time[4] (min) | 0.5% Aqueous Caustic[1] | NMP[2] |
|---|---|---|
| 0 | s | i |
| 10 | s | i |

TABLE 1-continued

| Time[4] (min) | 0.5% Aqueous Caustic[1] | NMP[2] |
|---|---|---|
| 20 | s | i |
| 30 | s | i |
| 40 | s | i |
| 50 | s | i |
| 60 | s | i |
| 90 | s | i |
| 120 | i[3] | i |

[1]Samples dried 30 min @ 100° C., 30 sec immersion
[2]Samples dried 30 min @ 100° C., followed by 30 min @ 200° C., 1 min immersion in NMP followed by a water wash
[3]Soluble after 60 sec
[4]Time at 80° C. in reaction vessel The above results show that the silicone polyamic acid made in accordance with the practice of the present invention can be photopatterned using a standard aqueous caustic positive resist developer, and resist the effects of a subsequent treatment with organic solvent used to remove the developed photoresist.

Silicon polyamic acid made in accordance with the practice of the invention was further evaluated for ability to resist imidization after being heated at 120° C. beyond a 30-minute drying period as shown in Table 1. The following results were obtained:

TABLE 2

| Drying Time (100° C.) (min) | 0.5% Aqueous Caustic[1] | NMP[2] |
|---|---|---|
| 0 | s | s |
| 15 | s | i |
| 30 | s | i |
| 45 | s | i |
| 60 | s | i |
| 90 | s | — |
| 120 | s | — |

[1]30 sec Immersion in 0.27 N aqueous Bu₄NOH
[2]After baking at 200° C. for 30 min, 1 min immersion The above results show that the silicone polyamic acid made in accordance with the practice of the present invention can be dried at 100° C. for an extended period of time without significantly affecting its ability to be patterned in aqueous caustic during the development of the photopatterned positive photoresist, while resisting subsequent treatment during the removal of the resist residue with an organic solvent prior to imidization.

EXAMPLE 2

In accordance with the procedure of Example 1, silicone polyamic acid films were prepared which were blended with 30% by weight of Sudan Black B. Pyralin polyimide, a commercial polyamic acid manufactured by E. I. duPont de Nemours & Co. of Wilmington, Del., was also blended with 30% by weight of Sudan Black B. Polyamic acid films were prepared from the blends and dried at 100° C. for 30 minutes and then developed as shown in the following table, where silicone copolymer is the silicon polyamic acid made in accordance with Example 1:

TABLE 3

| Develop Time[1] | Silicone Copolymer | Pyralin Polyimide |
|---|---|---|
| 30 sec | s | i - swells |
| 90 sec | s | partial lift |
| 120 sec | s | break-up insoluble |

[1]Immersed in 0.27 N Bu₄NOH

The above results show that after a 30-minute drying period at 120° C., the commercially available Pyralin polyimide was insoluble in the aqueous caustic. After 120 seconds of immersion time in the aqeos caustic the Pyralin polyamic acid remained totally insoluble but, in addition, began to break up.

Additional silicone polyamic acids were prepared in accordance with the procedure shown in Example 1, except that in one instance Bisphenol-A dianhydride was used in place of the DiSiAn to produce a silicone polyamic acid having approximately the same proportions of BPADA units and BTDA in the silicone polyamic acid. It was found that the silicone polyamic acid free of the DiSiAn units was insoluble when immersed in the aqueous caustic after a 30-minute drying period at 100° C.

EXAMPLE 3

In accordance with the procedure of Example 1, there was stirred a mixture to 80° C. for 1.5 hours consisting of 39.3483 grams (0.19651 mole) of oxydianiline, 22.7259 grams (0.049133 mole) of DiSiAn, and 250 ml of NMP. After 1.5 hours, there was then added to the mixture 47.4900 gram (0.14738 mole) of benzophenone dianhydride along with 160 ml of NMP. The mixture was warmed to 110° C. upon mixing and was allowed to cool to 100° C. The mixture was stirred and maintained at 100° C. for 2 hours and then cooled to room temperature.

There was added to a portion of the above silicone polyamic acid, a sufficient amount of the bis(tetrabutylammonium) salts of acid green #41 dye to provide a mixture having about 20% by weight of the dye based on the total weight of dye and silicone polyamic acid. The dye was prepared by the following procedure. A mixture was stirred at room temperature for one hour consisting of 8.7 grams (5.31 millimoles) of acid green #41 (dye content 40%), 2.95 grams (10.6 millimoles) of tetrabutylammonium chloride, 150 ml of water, and 150 ml of methylene chloride. The mixture was stirred at room temperature for one hour and at last separated. The solvent was removed from the organic layer under reduced pressure and the resulting solid dried in vacuo at 80° C. to obtain 5.1 gram (88%) of an intense green dye as a bis(tetrabutylammonium) salt.

A solution of the above silicone polyamic acid and green dye in sufficient N-methyl pyrrolidone to produce a 20% by weight mixture was spin coated onto a silicone wafer using a headway photoresist spinner model EC101 operating at 3500 rpm for 20 seconds. After baking the applied silicone polyamic acid for 30 minutes at 110° C., the resulting surface of the polyamic acid was found to be tack free. Photoresist (KTI 809) was then spun onto the treated silicone wafer and dried at 90° C. for 30 minutes to produce a one micron layer of photoresist on about a 4.5 micron silicone polyamic acid film. The wafer was then patterned using an Oriel exposure station with a 30-second exposure. Shipley microposit 312 developer diluted 1:1 with distilled water was then employed to develop the photoresist and polyamic acid by immersing the treated wafer in the developing solution for 1 minute at 25° C.

The patterned combination of resist and silicone polyamic acid was washed free of the developing solution and then further dried at 140° C. for 30 minutes. The photoresist was then stripped off with butylacetate solvent and the wafer dried.

The above photopatterned polyamic acid treated silicone wafer now free of resist was then heated to 200° C. for 60 minutes to fully imidize the silicone polyamic acid.

The above procedure was repeated with silicone polyamic acid tinted with blue and red dye to provide for the production of a color filter consisting of a 3–10 micron thick silicone polyamic acid converted to a silicone-polyimide and patterned in 250 micron by 250 micron squares of blue, green, and red.

Although the above examples are directed to only a few of the very many variables which can be used in the practice of the method of the present invention and to the products obtained therefrom, it should be understood that the method and products of the present invention are more broadly defined in the description preceeding these examples.

What is claimed and sought to be protected by Letters Patent of the U.S. is as follows:

1. A transparent substrate having an adherent silicone-polyimide film photopatterned on at least a portion of its surface, where the silicone-polyimide film is obtained by initially photopatterning a silicone polyamic acid on the surface of the transparent substrate involving the steps of
    (1) spin coating the silicone polyamic acid onto the surface of the transparent substrate,
    (2) drying the silicone polyamic acid at a temperature of at least 100° C.,
    (3) spin coating a photoresist onto the surface of the silicone polyamic acid,
    (4) exposing the applied positive photoresist to patterned UV light,
    (5) developing the composite of the spin coated photoresist and the silicone polyamic acid,
    (6) stripping remaining photoresist from the surface of the silicone polyamic acid with an organic solvent, and
    (7) heating the silicone polyamic acid until fully imidized, where the silicone polyamic acid is the product of reaction of substantially equal molar amounts of aryldiamine and organic dianhydride comprising a mixture of norbornane organosiloxane bisanhydride and aromatic organic bisanhydride.

2. A transparent substrate in accordance with claim 1, where the silicone polyimide is tinted with a dye.

* * * * *